United States Patent [19]
Agarwal

[11] Patent Number: 6,095,085
[45] Date of Patent: Aug. 1, 2000

[54] PHOTO-ASSISTED REMOTE PLASMA APPARATUS AND METHOD

[75] Inventor: Vishnu K. Agarwal, Boise, Id.

[73] Assignee: Micron Technology, Inc., Boise, Id.

[21] Appl. No.: 09/137,155

[22] Filed: Aug. 20, 1998

[51] Int. Cl.[7] .................................................. C23C 16/00
[52] U.S. Cl. ............................ 118/723 MP; 118/723 ER; 118/723 IR; 156/345
[58] Field of Search ...................... 156/345; 118/723 MP, 118/723 ER, 723 IR, 723 ME

[56] References Cited

U.S. PATENT DOCUMENTS

| | | |
|---|---|---|
| Re. 35,785 | 5/1998 | Sandhu et al. . |
| 4,842,676 | 6/1989 | Jucha et al. . |
| 4,913,929 | 4/1990 | Moslehi et al. . |
| 4,996,077 | 2/1991 | Moslehi et al. . |
| 5,018,479 | 5/1991 | Markunas et al. . |
| 5,180,435 | 1/1993 | Markunas et al. . |
| 5,252,178 | 10/1993 | Moslehi . |
| 5,522,343 | 6/1996 | Kodama ............................ 118/723 MP |
| 5,647,913 | 7/1997 | Blalock . |
| 5,662,770 | 9/1997 | Donohoe . |
| 5,753,886 | 5/1998 | Iwamura ............................ 219/121.43 |

FOREIGN PATENT DOCUMENTS 0 291 181 A2  4/1988  European Pat. Off. .

*Primary Examiner*—Richard Bueker
*Assistant Examiner*—Erin Fieler
*Attorney, Agent, or Firm*—Dickstein, Shapiro, Morin & Oshinsky

[57] ABSTRACT

The present invention provides a plasma processing system comprising a remote plasma activation region for formation of active gas species, a transparent transfer tube coupled between the remote activation region and a semiconductor processing chamber, and a source of photo energy for maintaining activation of the active species during transfer from the remote plasma activation region to the processing chamber. The source of photo energy preferably includes an array of UV lamps. Additional UV lamps may also be used to further sustain active species and assist plasma processes by providing additional in-situ energy through a transparent window of the processing chamber.

27 Claims, 1 Drawing Sheet

PHOTO-ASSISTED REMOTE PLASMA APPARATUS AND METHOD

FIELD OF THE INVENTION

The present invention relates to plasma-enhanced processes, more particularly to a photo-assisted remote plasma apparatus and method for maintaining high energy activated species for plasma-enhanced semiconductor fabrication processes.

BACKGROUND OF THE INVENTION

"Plasma-assisted" or "plasma-enhanced" processing has many applications in semiconductor device fabrication. Plasma-enhanced processing is a technique in which a substantially ionized gas generates active, metastable neutral and ionic species that chemically or physically react to deposit thin material layers on, or to etch material layers from, a semiconductor substrate in a reactor processing chamber.

Advanced semiconductor VLSI technologies employ plasma processing for a number of important steps in device fabrication. For example, plasma processing permits lower processing temperatures and higher deposition rates for growth and deposition of the layers of insulators, semiconductors, or metals. In addition, reactive ion etching (RIE) processes in low-pressure plasmas are used for anisotropic patterning of the submicron features in VLSI device structures.

Plasma-enhanced processing may use remotely-generated or locally-generated plasmas. A remote plasma is a plasma that is generated external to the reactor's semiconductor processing chamber. The plasma is guided into the processing chamber through a conduit from a remote plasma source, which is separated from the processing chamber where the plasma interacts with the semiconductor wafer for the desired fabrication process. An in-situ or localized plasma is a plasma that is generated within the semiconductor processing chamber where it interacts with the semiconductor wafer.

Conventional plasma processing equipment for etch and deposition applications usually employ a 13.56 MHz power source, a 2.5 GHz microwave source, or a combination of these energy sources for generating a plasma (glow discharge) from plasma feed gas. In typical systems, a plasma-generating radio-frequency power source connects electrically to an electrically conducting wafer holding device known as a wafer chuck. A radio-frequency energy source causes the chuck and wafer to produce a locally-generated radio-frequency plasma in the processing chamber with the semiconductor wafer. These systems typically include a showerhead assembly for injecting plasma-generating feed gas into the processing chamber. This is known as a parallel-plate configuration, due to the parallel surfaces of the chuck and showerhead. Still other configurations use a combination of local and remote plasmas.

In all of these known configurations, constraints exist which limit plasma process flexibility and capabilities. In localized plasma enhanced chemical vapor deposition (PECVD), for example, parent gas molecules are dissociated into precursor atoms and radicals which can deposit on substrates. The plasma supplies energy to break chemical bonds in the parent molecules that would only be broken by thermal decomposition if the plasma were not present. Parent molecule dissociation is accomplished in the plasma through collisions with electrons, ions, photons, and excited neutral species. Unfortunately, the precursor species are also subject to the same active environment which dissociated the parent molecules. This can lead to further dissociation or reaction of gas phase species to form more complicated radicals before the radicals can condense on the substrate. There is thus a wide spectrum of precursor species incident on the growing film.

A further complication of localized PECVD is that the substrate is immersed in the plasma region. This results in a large flux of charged species incident on the substrate during film deposition. This can lead to ion implantation, energetic neutral embedment, sputtering, and associated damage.

In addition, localized PECVD tends to deposit film in a very directional manner. This limits step coverage and conformality, resulting in thicker films in certain areas and thinner films in others, particularly at the bottom and along the bottom portions of trenches and contact vias. Thus, there are three major problems associated with conventional in-situ PECVD: adequate control over incident gas phase species, ion damage as a result of the substrate being immersed in the plasma region, and limited step coverage and conformality.

The use of a remote plasma system for remote plasma enhanced chemical vapor deposition (RPECVD) can help to alleviate all of these problems, but raises additional limitations relating to the transfer of active plasma species from the remote source to the semiconductor processing chamber. The lifetime of metastable oxygen, for example, typically allows pathlengths of 1–2 meters in the transfer conduit from a remote plasma source to the semiconductor processing chamber. The pathlength of a typical metastable excited noble gas species, e.g., He*, is only 5–30 cm. Nitrogen and various other activated species important to plasma-enhanced processing have similarly short, or even shorter, pathlengths. Therefore, an important limitation of remote plasma reactors is that desired activated species often cannot reach the semiconductor substrate in a sufficiently activated state and adequate concentration for efficient plasma-enhanced processing.

What is needed is a new and improved plasma-enhanced apparatus and method which overcomes the problems in the prior art techniques, including inadequacy of the control over incident gas phase species, ion damage to the substrate, limited step coverage/conformality, and the limited lifetime and diffusion length of the active species generated by remote plasma sources.

SUMMARY OF THE INVENTION

The present invention provides a plasma processing apparatus and method including a remote plasma activation region for formation of active gas species, and a transparent transfer tube coupled between the remote activation region and a semiconductor processing chamber. A source of photo energy is provided to sustain activation of the active species during transfer from the remote plasma activation region to the processing chamber. The source of photo energy preferably includes an array of UV lamps. Additional UV lamps or other photo energy sources may also be used to further sustain active species and assist plasma processes by providing additional energy through a transparent wall of the processing chamber. The apparatus of the invention may be used for any plasma-enhanced processing technique, including, but not limited to, RPECVD and RIE, and is particularly well-suited for any techniques using plasma activated species having relatively short lifetimes in semiconductor fabrication or other plasma-assisted processes.

DETAILED DESCRIPTION OF THE PREFERRED EMBODIMENTS

Figure 1:
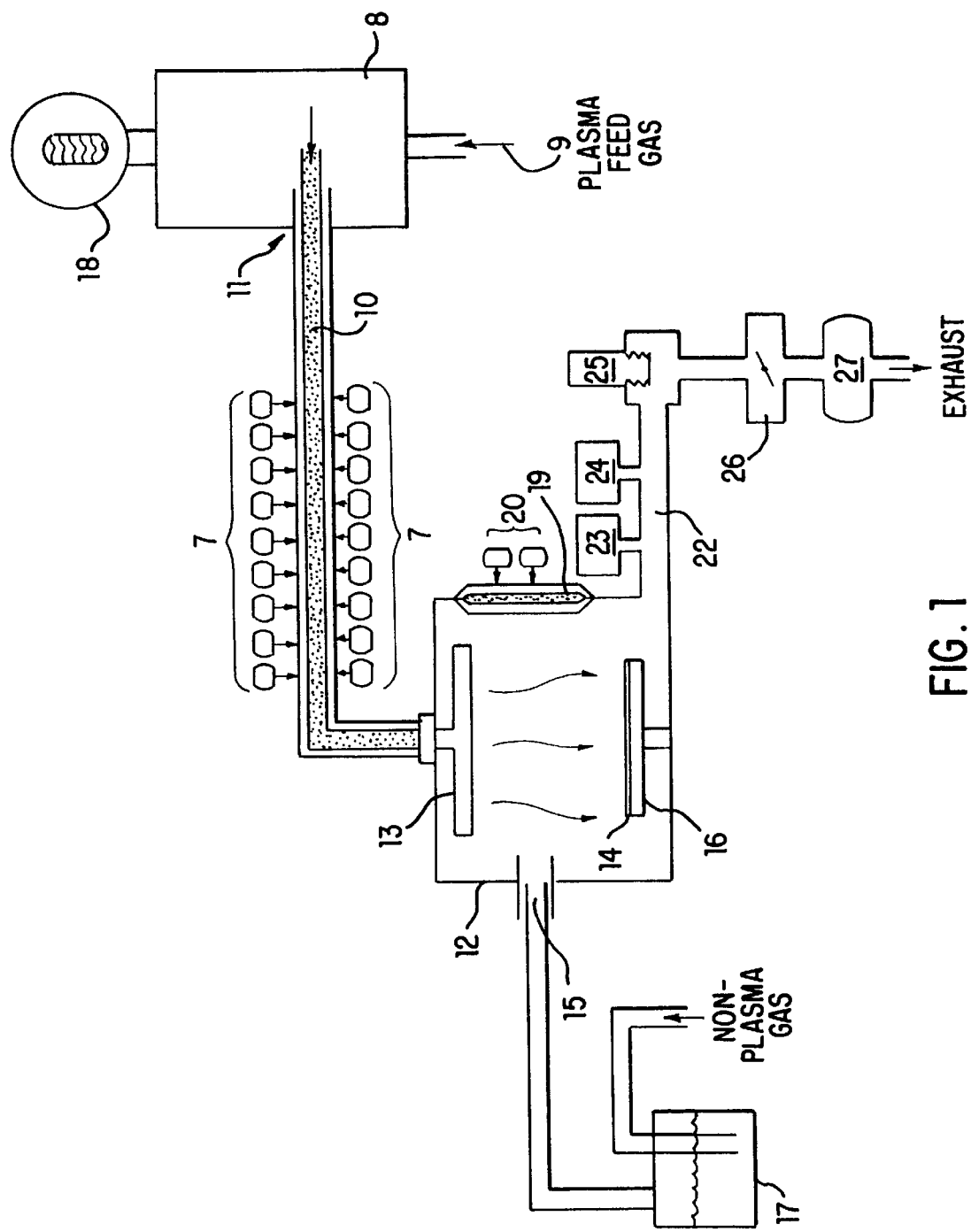
FIG. 1 is a block schematic diagram of one embodiment of the reactor system, including remote plasma generation and photo-assist equipment, of the subject process and apparatus of the present invention.

In the following detailed description which follows, reference is made to various specific embodiments in which the invention may be practiced. These embodiments are described in sufficient detail to enable those skilled in the art to practice the invention, and it is to be understood that other embodiments may be utilized and that specific equipment, processing steps, energy sources, and other changes may be made without departing from the spirit and scope of the present invention.

The terms "wafer" or "substrate" as used herein include any semiconductor-based or other structure having an exposed surface in which to form a structure using the apparatus or method of this invention. Wafer and substrate are to be understood as including silicon-on-insulator, doped and undoped semiconductors, epitaxial layers of silicon supported by a base semiconductor foundation, and other semiconductor structures. Furthermore, when reference is made to a wafer or substrate in the following description, previous process steps may have been utilized to form active devices, regions or junctions in the base semiconductor structure or foundation.

The reactor apparatus of the invention as discussed below includes a remote region of plasma generation for activation of a gas or mixture of gases, and photo-assisted maintenance of activation from the remote region of activation to the processing chamber where film deposition, etching or other fabrication steps takes place on a substrate within the processing chamber. Applications of the photo-assisted remote plasma apparatus and method of the invention for plasma-enhanced processing in semiconductor device manufacturing include remote plasma-enhanced chemical-vapor deposition (RPECVD) of dielectrics, silicon, tungsten nitride ($WN_x$), titanium, aluminum, copper, and other materials; high-rate reactive-ion etching (RIE) of, e.g., thin films of polysilicon, metal, oxides, nitrides, and polyimides; planarized inter-level dielectric formation, including procedures such as biased sputtering; low-temperature epitaxial semiconductor growth processes; and other applications and methods which will be apparent to those of skill in the art given the teachings herein.

FIG. 1 shows a block diagram of a remote plasma photo-assisted processing apparatus according to the present invention. A feed gas stream (single gas, vapor, or mixture) enters remote plasma generation region 8 at plasma feed gas injector port 9. Within the remote plasma generation region 8, the plasma feed gas has its internal energy activated, i.e., increased, in one or more of a variety of different ways. For example, one or more components of the feed gas may be ionized; one or more components of the feed gas may be dissociated into more reactive species; or the internal energy of the feed gas may be increased without ionization. This can be accomplished by equipment internal to the remote plasma generation region 8 by, e.g., heaters, catalytic surfaces, or electron or ion bombardment sources, or by equipment external to the remote plasma generation region 8 by, e.g., microwave sources, radio frequency sources, or heaters. Whatever the plasma feed gas, the method for activation, or the active species formed in the remote plasma generation region 8, energy is coupled into one or more gases, and that energy is sustained by a photo energy source 7 as the active species are transferred through transparent conduit 10 to contribute to subsequent reactions in the processing chamber 11.

In the remote plasma generation region 8, only gases from the plasma feed gas injector 9 are present. Other gases that may be present in other regions of the apparatus cannot reach the remote plasma generation region 8 by diffusion or other processes that would allow such gases to enter through the exit 11 of remote plasma generation region 8 into transparent conduit 10. In the flow system shown in FIG. 1, the physical separation of the various regions of the reactor, coupled with the flow velocity of the gas stream, which of course depends on the selection of process parameters in those regions, prevents back-diffusion of gases into remote plasma generation region 8.

Referring again to FIG. 1, a microwave generator 18, controlled by a tuner and power meter (not shown), adjacent to the remote plasma generation region 8 provides power to create a "plasma" (glow discharge) of the plasma feed gas in remote plasma generation region 8. A pure noble gas plasma feed gas, nitrogen or hydrogen, are typically used for RPECVD, but the apparatus of the invention is not limited to any particular gas or gas mixtures. The plasma feed gas may also contain, for example, $WF_6$. The plasma environment in the remote plasma generation region 8 typically contains many active species, even with a simple feed gas like helium. The active species produced in remote plasma generation region 8 include ions, electrons, and a host of excited species with different lifetimes.

A photo energy source 7 is positioned so as to direct photo energy through transparent conduit 10 to the active species generated in remote plasma region 8 as the active species flow through conduit 10 toward processing chamber 12. Photo energy source 7 can include any source of photo energy capable of sustaining the activity of one or more activated plasma species within conduit 10. The preferred sources of photo energy are laser energy and UV lamps, most preferably, an array of UV lamps, but other sources may also be used so long as one or more of the active species generated in remote plasma generation region 8 have a higher energy level when they reach processing chamber 11 than such species would have in the absence of the photo energy transferred from photo energy source 7.

The flow through the remote generation region 8 carries the species downstream through transparent conduit 10 to the plasma showerhead 13 and substrate 14 mounted in a deposition region downstream of the showerhead 13 in processing chamber 12. Transparent conduit 10 provides a sealed pathway through which the activated species from remote plasma generation region 8 flow to enter processing chamber 12. Conduit 10 can be manufactured from quartz, sapphire or any transparent material that is inert or substantially non-reactive with respect to the active species. The preferred materials for the walls of conduit 10 are transparent quartz, non-reactive polymers, or a combination of quartz and non-reactive polymers provided in one or more concentric layers to make up the wall of the transfer tube.

The distance that the various species can travel before they are annihilated depends upon their lifetimes, the flow velocity, and the intensity of photo-assist produced by photo energy source 7. The degree of photo-assist and the flow velocity of the plasma feed gases through injector port 9 are controlled so as to maintain and control the concentration of desired active species at a given distance downstream of the remote plasma generation region 8, such as at the interaction region of the processing chamber 12 for desired active species, and at a point in the transparent conduit 10 prior to the interaction region for any undesired active species, which will depend upon the particular fabrication technique being conducted in processing chamber 12.

If desired, a non-plasma parent gas, carrier gas, secondary precursor gas, or other gas or gas mixture (collectively referred to herein as "non-plasma gas") may be transferred through non-plasma gas injector port 15 to interact with the activated plasma species in processing chamber 12. Optionally, the non-plasma gas may be mixed with the active species in a premix chamber (not shown) prior to entering processing chamber 12, or they may be mixed in showerhead 13.

The photo-assisted apparatus can be employed in any plasma-enhanced processing system where remote plasma generation is used. The preferred applications of the apparatus of the invention include chemical vapor deposition of, for example, thin films of Ti or $WN_x$. When operated for RPECVD, the flux of activated gas species partially dissociates and activates (in the gas phase) a non-plasma gas in processing chamber 12. The flux of the activated gas species reacts and orders the activated non-plasma gas species onto the substrate 14 within processing chamber 12 of the remote plasma enhanced chemical vapor deposition reactor system as depicted in FIG. 1.

Deposition processes typically take place in a cold wall vacuum processing chamber in which pressure has been reduced to between 0.1 and 100 torr, preferably a pressure of about 0.5 torr. A wafer 14, e.g., on which the deposition will be performed, is mounted on a chuck 16, which may be heated (if desired) to a temperature within a range of 200°–600° C. by a heat lamp array (not shown). A non-plasma gas enters bubbler apparatus 17. A non-plasma gas flow rate of about 100 sccm is maintained through bubbler apparatus 17 during the deposition process. Other techniques for vaporizing a semivolatile compound are also known in the art and may be used in place of bubbler apparatus 17.

The activated species, and non-plasma gas, are ducted to a shower head 13, and non-plasma gas injector 15, respectively, from which they enter the processing chamber 12. Relatively uncontaminated material deposits on the surface of the wafer. It is hypothesized that as soon as the mixing of the activated species and the non-plasma gas has occurred, the activated species begin to dissociate the molecules of the non-plasma gas to form precursor molecules. Thus, the non-plasma gas and the activated species are mixed, preferably, in the processing chamber 12, or just prior to being ducted into the processing chamber 12 in a premix chamber (not shown), or in showerhead 13. Reaction products and non-plasma gas species are then withdrawn from the chamber 12 via an exhaust manifold. Incorporated in the exhaust manifold are a pressure sensor 23, a pressure switch 24, a vacuum valve 25, a pressure control valve 26, and a blower 27. A particulate filter filters out solid reactants before the exhaust is vented to the atmosphere.

According to a particularly preferred embodiment, at least a portion of the wall of processing chamber 12 comprises a transparent window 19. Window 19 may be made of quartz, sapphire, clear polymeric material, or other transparent materials or combinations thereof. In this embodiment, a photo energy source 20 is juxtaposed outside transparent wall 19 to assist in maintaining the activation energy of the active species inside processing chamber 12.

As indicated above, the photo-assisted remote plasma reactor apparatus of the invention is capable of performing any plasma-enhanced process in which a remote plasma is desired, including, for example, low temperature chemical vapor deposition, nitridation, passivation, low temperature epitaxial growth, surface cleaning, anisotropic etching, and high density plasma (HDP) processing. A preferred low temperature chemical vapor deposition application is the deposition of $WN_x$. Nitrogen and hydrogen are passed through and activated in remote plasma generation region 8 using about 800–2000 W of microwave power. The active species then flows through the transparent conduit 10, with UV photo assist, to processing chamber 12, where $WF_6$ is then added to the processing chamber through the non-plasma gas injector port 15. The result is deposition of tungsten nitride thin film on substrate 14.

An additional preferred chemical vapor deposition process is the deposition of titanium. Hydrogen is passed through remote plasma generation region 8 and activated by microwave, RF or other suitable power source. Hydrogen plasma then flows through transparent conduit 10, with photo assist, to processing chamber 12 where $TiCl_4$ is added through the non-plasma gas injector port 15. The result is deposition of a thin Ti film on substrate 14.

A low temperature epitaxial layer can be grown using argon passed through remote plasma generation region 8, along with silane and hydrogen being passed through the non-plasma gas injector port 15. The pressure in the processing chamber could be $1 \times 10^{-3}$ Torr at 750° C. Again, a photo energy source, preferably UV lamps, sustains the activation level of the Ar gas as it is conveyed through a transparent conduit 10 to the processing chamber 12.

Another typical low temperature chemical vapor deposition process is oxide planarization technology for deposition of a planarized oxide layer on a surface having an uneven surface, e.g., hills and valleys. In this process, oxygen and argon are activated in remote plasma generation region 8, and transferred to processing chamber 12 with photo assist. Silane is added through the non-plasma gas injector port 15 to processing chamber 12. A large RF signal is applied to substrate 14 for a short planarization time which effects the actual planarization.

One possible anisotropic etch process is the etching of silicon dioxide with selectivity to silicon. This is accomplished by passing $C_3F_8$ gas through remote plasma generation region 8 using about 60 watts of microwave power as well as about 200 volts peak to peak RF at 800 kHz and $5 \times 10^{-4}$ Torr. Another possible anisotropic etch process could be the etching of silicon. This is accomplished by passing $SF_6$ and argon gas through remote plasma generation region 8 and using about 600 watts of microwave power as well as about 100 volts peak to peak RF at 13.56 MHz and $3 \times 10^{-4}$ Torr. In each etch process, the transparent conduit 10 and photo energy source 7 sustains the energy level of the active plasma species for efficient plasma processing in the processing chamber 12.

The above description illustrates preferred embodiments which achieve the objects, features and advantages of the present invention. Unless specifically stated otherwise above, the pressure, temperature, and other process parameters, and the power and frequencies used for plasma generation and photo-assisted maintenance of active species, can be widely varied, so long as photo energy is utilized to help to sustain the energy of one or more active species as such species are transferred through a transparent conduit from a remote plasma generation region to a processing chamber. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A remote plasma reactor, comprising:

a processing chamber;

a plasma generation region for generating active gas species outside said processing chamber;

a transparent conduit for conveying said active gas species from said remote plasma generation region to said processing chamber; and a photo energy source which provides photo energy to said active species during transfer in said conduit.

2. A reactor as claimed in claim 1, further comprising at least one non-plasma gas conduit for admitting non-plasma gas to said processing chamber.

3. A reactor as claimed in claim 2, further comprising a premix chamber connected to said transparent conduit, said non-plasma gas conduit, and said processing chamber, for mixing said non-plasma gas and active gas species outside said processing chamber.

4. A reactor as claimed in claim 1, wherein said photo energy source comprises an ultraviolet source.

5. A reactor as claimed in claim 1, wherein said photo energy source comprises an array of ultraviolet lamps.

6. A reactor as claimed in claim 1, wherein said processing chamber further comprises a transparent window, and wherein a photo energy source is positioned outside said window to sustain the activation of one or more gas species within said processing chamber.

7. A reactor as claimed in claim 6, wherein said transparent window is made from a material selected from the group consisting of quartz and sapphire.

8. A reactor as claimed in claim 1, wherein said transparent conduit further comprises a quartz conduit.

9. A reactor as claimed in claim 1, wherein said conduit has an exhaust end emptying into said processing chamber, the exhaust end being arranged in a showerhead.

10. A reactor as claimed in claim 9, further comprising at least one non-plasma gas conduit for admitting non-plasma gas to said processing chamber.

11. A reactor as claimed in claim 10, wherein said non-plasma gas is mixed with said activated gas species in said showerhead.

12. A reactor as claimed in claim 1, wherein said transparent conduit comprises at least one inner wall and at least one outer wall wherein one of said inner or outer walls comprises a transparent polymeric material, and said other of said inner or outer walls comprises a material selected from the group consisting of quartz and sapphire.

13. A reactor as claimed in claim 6, wherein said transparent window comprises at least one inner and at least one outer wall wherein one of said inner or outer walls comprises a transparent polymeric material, and said other of said inner or outer walls comprises a material selected from the group consisting of quartz and sapphire.

14. A reactor for carrying out plasma-enhanced processing of a semiconductor substrate, comprising:

a vacuum chamber;

a substrate support within said vacuum chamber;

a plasma generation chamber for generating activated plasma gas species from a feed gas;

a transparent conduit for conveying activated plasma gas species from said plasma generation chamber to said vacuum chamber;

a first photo energy source mounted adjacent to the outer surface of said conduit and facing said conduit for sustaining the activation of one or more of said active species being conveyed through said conduit; and wherein at least one wall of said vacuum chamber has a transparent window whereby a second photo energy source positioned outside said window provides photo energy into said vacuum chamber for sustaining the activation energy of one or more gas species within said chamber.

15. A reactor as claimed in claim 14, further comprising at least one non-plasma injector port connected to at least one gas source for conveying non-plasma gas to said vacuum chamber.

16. A reactor as claimed in claim 14, wherein said first and second photo energy sources comprise an array of ultraviolet lamps.

17. A reactor as claimed in claim 14, wherein said window is a quartz window.

18. A reactor as claimed in claim 14, wherein said transfer conduit is a quartz tube.

19. A reactor as claimed in claim 14, wherein said conduit has an exhaust end emptying into said vacuum chamber, the exhaust end being arranged in a showerhead concentric with the center of said substrate support.

20. A reactor for carrying out remote plasma-enhanced chemical vapor deposition on a semiconductor substrate, comprising:

a substrate processing chamber;

a substrate support for supporting a substrate within said processing chamber;

a remote plasma generation chamber for producing activated plasma gas species from a feed gas and having an output coupled to said processing chamber;

a transparent transfer tube for conveying said activated species from the remote plasma generation chamber to said processing chamber;

a photo energy source mounted adjacent to the outer surface of said transfer tube for sustaining at least a portion of the activation energy of one or more of said active species during conveyance through said transport tube; and at least one non-plasma gas injector port connected to a gas source for conveying non-plasma gas to said processing chamber.

21. A reactor as claimed in claim 20, wherein said photo energy source is selected from the group consisting of a laser source and an ultraviolet source.

22. A reactor as claimed in claim 20, wherein said transfer tube is a quartz tube.

23. A reactor as claimed in claim 20, wherein said processing chamber contains a transparent window and a second photo energy source is positioned outside said window to provide photo energy into said chamber.

24. A reactor as claimed in claim 23, wherein said window is a quartz window.

25. A reactor as claimed in claim 23, wherein said window is a sapphire window.

26. A reactor as claimed in claim 20, wherein said transfer tube has an exhaust end emptying into said processing chamber, the exhaust end being arranged in a showerhead concentric with the center of said substrate.

27. A reactor as claimed in claim 20, further comprising a premix chamber for mixing non-plasma gas and activated species outside said processing chamber.

* * * * *